United States Patent

Palalau et al.

[11] Patent Number: 5,774,075
[45] Date of Patent: Jun. 30, 1998

[54] DIGITAL SWITCH WITH ANALOG FEEL

[75] Inventors: Silviu Palalau, Birmingham; Daniel Toffolo, Dearborn, both of Mich.

[73] Assignee: UT Automobile Dearborn, Inc., Dearborn, Mich.

[21] Appl. No.: 706,170

[22] Filed: Aug. 30, 1996

[51] Int. Cl.[6] .................... H03K 17/94; H03M 11/00
[52] U.S. Cl. .................... 341/35; 200/37 A; 341/26; 345/184; 455/170.1
[58] Field of Search .................... 345/184; 341/35, 341/26; 200/37 A, 11 DA, 11 TW; 455/154.1, 170.1

[56] References Cited

U.S. PATENT DOCUMENTS

| | | | |
|---|---|---|---|
| 4,443,670 | 4/1984 | Nakamura et al. | 200/11 DA |
| 4,568,927 | 2/1986 | Fowler | 200/37 A |
| 4,697,057 | 9/1987 | Fowler | 200/37 A |
| 4,755,646 | 7/1988 | Fowler | 200/37 A |
| 4,758,693 | 7/1988 | Hoffman | 200/11 TW |
| 4,777,483 | 10/1988 | Fowler | 200/11 DA |
| 4,876,416 | 10/1989 | Frantz et al. | 2500/11 DA |
| 4,970,512 | 11/1990 | Wood | 200/11 DA |
| 5,128,661 | 7/1992 | Fowler | 200/11 TW |

OTHER PUBLICATIONS

International Search Report on International Application No. PCT/US97/14453.
Article from Electronic Engineering (Feb. 1964–pp. 72–79) on "A Digital Shaft Position Indicator" (XP 002047070) by S. G. Smith, B.Sc., and C. J. U. Roberts.

Primary Examiner—Michael Horabik
Assistant Examiner—Timothy Edwards, Jr.
Attorney, Agent, or Firm—Howard & Howard

[57] ABSTRACT

A manually controllable switch provides a user with an "analog feeling" for controlling digital electronics. A plurality of first electrical conducting portions are alternately arranged with a plurality of second electrical conducting portions. Physical spacing between electrical conducting portions is proportionally and symmetrically varied to provide a sequence of logical states upon movement of the manually adjustable control knob. An electrical contact on the control knob moves into and out of engagement with the electrical conducting portions. Contact between the contacting portion and the conducting portions causes changes in logic state as recognized by a microprocessor or dedicated circuitry coupled to the conducting portions. The microprocessor or dedicated circuitry recognizes specific sequences of change in logic state as indicating manual movement of the control knob.

18 Claims, 1 Drawing Sheet

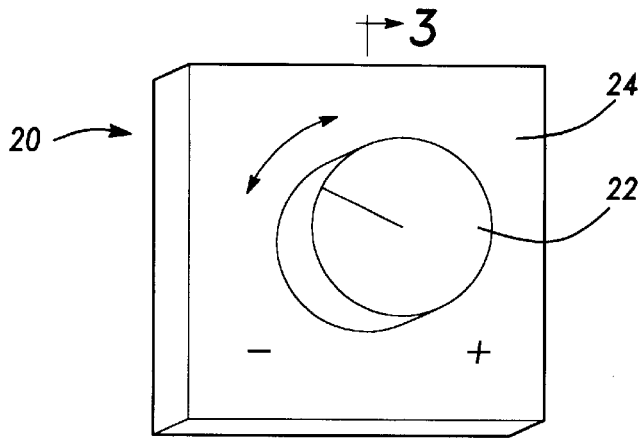
*Fig-1*
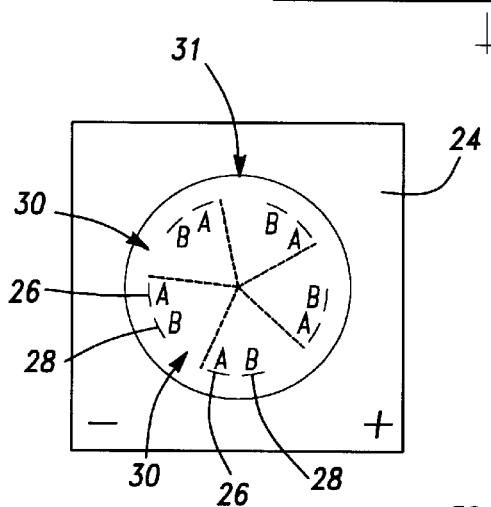
*Fig-2*
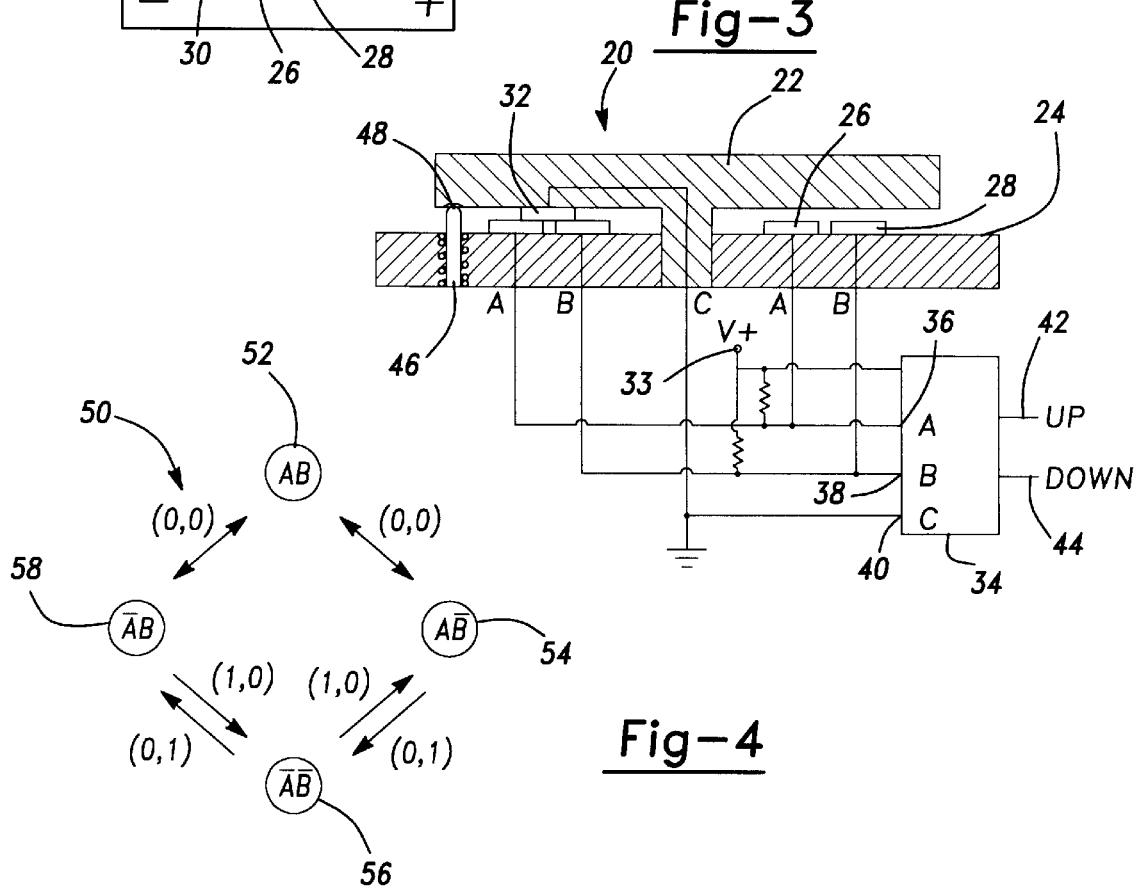
*Fig-3*
*Fig-4*

DIGITAL SWITCH WITH ANALOG FEEL

BACKGROUND OF THE INVENTION

This invention relates to a switch assembly for generating digital electrical signals while presenting a user of the switch with an analog feel.

The majority of modern electrical devices rely on digital electronics. While many consumers prefer the advantages associated with digital electronics, some consumers tend to prefer an analog "feeling" device.

Consider, for example, a radio. With analog electronics, the volume control typically includes a rotary dial that, when turned by a user, changes the level of volume. With digital electronics, typical volume controls include one or more buttons that are repeatedly pushed to incrementally increase or decrease the volume. Many consumers tend to prefer the rotary dial volume adjustment that is typically associated with an analog electronic device. Accordingly, there is a need for a switch that is capable of communicating with digital electronics while providing a user with an analog feel.

Attempts have been made to provide digital switches that appear to operate the same as an analog switch. Previous attempts, however, have included relatively complex and relatively expensive arrangements of counters or other electronics for producing a digital output.

This invention is a switch assembly that provides a user with an analog-feeling adjustment for producing digital signals. The arrangement of components and the method associated with this invention provides a relatively simple and versatile switch assembly that overcomes the drawbacks of previous attempts.

SUMMARY OF THE INVENTION

In general terms, this invention is a switch assembly for producing digital, electrical signals. The switch assembly includes a base and a plurality of electrical conducting portions which preferably are supported on the base. The electrical conducting portions are arranged such that a first distance between one of the conducting portions and a first adjacent conducting portion is greater than a second distance between the one conducting portion and a second adjacent conducting portion that is on an opposite side of the one conducting portion from the first adjacent conducting portion. A control knob is movably supported for movement relative to the base. An electrical contact portion which preferably is supported on the control knob described above has a dimension that is smaller than the first distance. The dimension of the electrical contact portion is also greater than the second distance mentioned above. The contact portion on the control knob contacts one or more of the electrical conducting portions on the base as the knob moves relative to the base to thereby generate digital electrical signals that indicate which direction the knob is moved.

The various features and advantages of this invention will become apparent to those skilled in the art from the following detailed description of the preferred embodiment. The drawings that accompany the detailed description can be described as follows.

BRIEF DESCRIPTION OF THE DRAWINGS

FIG. 1 is a perspective, diagrammatic illustration of a switch designed according to this invention.

FIG. 2 is a top elevational view schematically illustrating a feature of the embodiment of FIG. 1.

FIG. 3 is a cross-sectional view taken along the line 3—3 in FIG. 1.

FIG. 4 diagrammatically illustrates the preferred way that the embodiment of FIG. 1 operates.

DETAILED DESCRIPTION OF THE PREFERRED EMBODIMENT

FIG. 1 diagrammatically illustrates a digital switch 20 that operates in a manner that provides a user of the switch with an analog-feeling device. A control knob 22 is rotatably supported on a base portion 24 so that the knob 22 rotates according to the arrows shown. The control knob 22 is used, for example, to control the volume on a radio. For purposes of illustration, this specification will discuss a radio volume control but the switch assembly of this invention is not limited to radios or volume control. Those skilled in the art will appreciate that a switch designed according to this invention has many additional possible uses such as radio tuning, light brightness control, screen display intensity, etc.

FIG. 2 schematically illustrates the base 24 with the knob 22 removed to expose part of the electronics associated with the switch assembly 20. A plurality of first electrical conducting portions 26 and a plurality of second electrical conducting portions 28 are supported on the base 24. The first and second conducting portions are staggered or alternated as illustrated. In other words, each of the first conducting portions has a second conducting portion adjacent to it on either side and each second conducting portion has a first conducting portion adjacent to it on either side.

The electrical conducting portions 26 and 28 are arranged on the base 24 such that a first distance between one of the conducting portions and an adjacent conducting portion is greater than a second distance between the one conducting portion and a second adjacent conducting portion that is on an opposite side of the one conducting portion. This spatial arrangement provides for gap portions 30 between some of the conducting portions. The arrangement of FIG. 2 has been schematically divided by the broken lines into five segments, each having a first conductor 26, a second conductor 28 and a gap portion 30. The broken lines of FIG. 2 are for illustrating the symmetrical and proportional spacing of the conducting portions only.

Consider the segment of FIG. 2 that is labeled 31. The distance between the second conducting portion 28 and the first conducting portion 26 is less than the size of the gap portion 30. The same spacing of the conducting portions preferably is maintained within each segment.

Turning to the illustration of FIG. 3, which is a cross-sectional view taken along the line 3—3 of FIG. 1, the operation of the inventive switch assembly will be described. The control knob 22 includes an electrical contact portion 32. The contacting portion 32 is positioned on the control knob 22 so that it moves along the generally arcuate path defined by the positions of the conducting portions 26, 28 and the gap portions 30 when the knob 22 is rotated.

The electrical contact portion 32 preferably is grounded such that it has a bias of zero volts. Each of the plurality of first conducting portions 26 are electrically coupled together and to a voltage source 33. The voltage source 33 can be, for example, a conventional 12-volt source. Similarly, each of the plurality of second conducting portions 28 are electrically coupled together and to the voltage source 33. A microprocessor 34 has an input 36 coupled to the first conducting portions 26, an input 38 coupled to the second conducting portions 28 and an input 40 coupled to the contact portion 32.

The term "microprocessor" as used in this specification is used in a generic sense. The microprocessor 34 can include a dedicated microprocessor for performing the functions to be described below. Alternatively, the microprocessor 34 can comprise a portion of a microprocessor that is capable of performing other functions within an electronic device. The microprocessor 34 also can include a custom designed integrated circuit chip or one or more standard integrated circuit chips that include a decoder and a pulse generator. Whatever circuitry or software is implemented within microprocessor 34, it preferably includes two outputs 42 and 44. The output 42 is for a digital signal indicating that the control knob 22 has been turned in a direction indicating a desired increase. The output 44 is for a digital electrical signal indicating that the control knob 33 was turned in a direction indicating a desired decrease.

Since the first conducting portions 26 are coupled to the voltage source 33, the input 36 is normally positively biased or set to "logic high." Similarly, the second conducting portions 28 are coupled to the voltage source 33 and the input 38 is normally at "logic high." When the contacting portion 32 is moved into contact with one of the conducting portions, that conducting portion, and all those coupled to it, is grounded. For example, when the control knob 22 is in the position illustrated in FIG. 3, the contacting portion 32 is in contact with one of the first conducting portions 26 and one of the second conducting portions 28, simultaneously. In the illustrated position, therefore, all three inputs to the microprocessor 34 are at "logic low."

The contacting portion 32 is specifically dimensioned, given the spacing between the first and second conducting portions, such that it is capable of contacting the first conducting portion 26 and the second conducting portion 28 within a given segment (as schematically illustrated in FIG. 2). The contacting portion 32 is also capable of contacting only one of the conducting portions within a given region. The size of the gap portions 30 must be greater than the dimension of the contacting portion 32 such that when the contacting portion 32 is aligned with a gap portion 30, there is no contact between the contacting portion 32 and any of the conducting portions 26 or 28. The changes in the values of the inputs 36 and 38 as caused by movement of the contact portion 32 into an out of electrical contact with the first and second conducting portions effectively indicates the manual adjustment of the control knob 22.

In the most preferred embodiment, the control knob 22 and the base portion 24 include a detent arrangement for maintaining the control knob 22 in a selected position. The detent arrangement can include, for example, a spring biased member 46 that is biased into engagement with a plurality of notches 48 spaced about the control knob 22. Those skilled in the art will appreciate that a variety of detent mechanisms are available. In one preferred embodiment, the number of notches 48 corresponds to the number of gap portions 30 so that the knob 22 is biased into a rest position where the contactor member 32 is aligned with a gap portion 30.

Referring to FIG. 4, the preferred method for generating digital electrical signals indicative of the manual movement of the control knob 22 will be described. FIG. 4 describes a logic state diagram 50. Each combination of a first conducting portion 26, a second conducting portion 28 and a gap portion 30 present four possible logic states. Each of these states are indicated at the circles 52, 54, 56, and 58. Each logic state corresponds to a position of the contactor member 32 within a given segment.

When the contacting portion 32 is in alignment with a gap portion 30, the logic state 52 exists. When the contacting portion 32 is aligned with a gap portion 30, there is no contact between the contacting portion 32 and any of the conducting portions 26 or 28. Accordingly, the inputs 36 and 38 are both at logic high indicated by AB within the circle 52. Assuming the knob 22 is moved in a clockwise direction, indicating a desire to increase the volume of a radio, for example, the contacting portion 32 will first contact a second conducting portion 28. This is indicated within the circle 54 that the input 36 (as shown in FIG. 3) is at logic high and the input 38 (in FIG. 3) is at logic low because the second conducting portion 28 is grounded. According to the method illustrated in FIG. 4, the microprocessor 34 is programmed, or the dedicated electronics are suitably arranged such that, movement of the knob 22 corresponding to a change in logic state from the circle 52 to the circle 54 does not result in any digital signal production.

Continued movement in a clockwise direction enables the contacting portion 32 to contact a second conducting portion 28 and a first conducting portion 26, simultaneously. This results in the logic state indicated at the circle 56. Both of the inputs 36 and 38 are grounded and, therefore, at logic low. Movement from the position at 54 to the position at 56 preferably is interpreted by the microprocessor 34 as a desire to increase the volume of the radio. Accordingly, a digital signal, such as a pulse, is produced and provided on output 42. Continued movement in a clockwise direction enables the contacting portion 32 to contact the first conducting portion 26 but no longer the second conducting portion 28. This position corresponds to the circle 58 in FIG. 4 where the first conducting portion 26 is grounded while the second conducting portion remains at logic high. Movement from the position 56 to the position 58 preferably is interpreted by the microprocessor 34 as indicating a desire to increase the volume. Accordingly, another digital signal is produced along output 42.

Continued movement of the control knob 22 in a clockwise direction will move the contacting portion 32 out of engagement with the first conducting portion 26 and onto another gap portion 30 (i.e., into another segment). This corresponds to movement from the circle 58 to the circle 52. The microprocessor 34 preferably does not cause any change in the volume upon such movement of the control knob 22.

In a similar fashion, movement in a counterclockwise direction would result in decreasing the volume moving from the position 58 to the position 56 and from the position 56 to the position 54. In both instances a digital signal will be produced and provided on output 44. Most preferably, no change in the volume occurs in movement from the position 54 to the position 52 or from the position 52 to the position 58.

The gap portions 30, which enable the logic position 52 to exist, enable the switch assembly 20 to process movement of the control knob 22 in either direction (i.e., clockwise or counter-clockwise) without requiring complex circuitry. If the gap portions 30 were not present and the logical state 52 did not exist, it would not be as easy for the switch assembly 20 to process movement of the contacting portion 32 between alternating conducting portions because movement in either direction would appear the same. In other words, without the gap portions 30, movement from a first conducting portion 26 to a second conducting portion 28 would appear electrically the same in either a clockwise or counterclockwise direction. The gap portions 30, and the logical scheme described in association with FIG. 4, however, provide a relatively simple system that is effective for generating digital signals to indicate a desired increase or decrease through movement of a manually controllable analog-feeling control knob.

The foregoing description is exemplary rather than limiting in nature. Variations and modifications of the described embodiment will become apparent to those skilled in the art that do not necessarily depart from the purview and spirit of this invention. For example, a rotating control knob was illustrated while a knob that slides along a generally linear path would also fall within the scope of this invention. Similarly, a specific order of changes in logical state were illustrated and described that could be modified. Accordingly, the legal scope given to this invention can be determined only by studying the appended claims.

What is claimed is:

1. A switch assembly for generating digital electrical signals, comprising:

a base;

a control knob movably supported for movement relative to said base;

a plurality of electrical conducting portions supported on one of said control knob or said base, said conducting portions being arranged such that a first distance between one of said conducting portions and a first adjacent conducting portion on one side of said one conducting portion is greater than a second distance between said one conducting portion and a second adjacent conducting portion on another side of said one conducting portion opposite from said first adjacent conducting portion; and an electrical contact portion supported on the other of said control knob or said base and having an operative dimension that is smaller than said first distance and greater than said second distance, said electrical contact contacting one or more of said electrical conducting portions as said control knob moves relative to said base to thereby generate digital electrical signals indicative of movement of said control knob.

2. The switch assembly of claim 1, wherein said control knob is slidably supported for generally linear movement relative to said base and said plurality of electrical contact portions are arranged in a generally linear pattern.

3. The switch assembly of claim 1, wherein said conducting portions are supported on said base and said electrical contact portion is supported on said control knob.

4. The switch assembly of claim 1, wherein said electrical contact portion is a single-piece contact having said operative dimension.

5. The switch assembly of claim 1, wherein there is only one said electrical contact portion that is a single piece of conductive material.

6. The switch assembly of claim 1, wherein said control knob is rotatably supported for rotational movement relative to said base and said plurality of electrical contact portions are arranged in a generally circular pattern.

7. The switch assembly of claim 6, wherein said control knob rotates about a central axis and wherein said plurality of electrical contact portions are all radially spaced from said central axis an equal distance.

8. The switch assembly of claim 1, wherein said plurality of conducting portions includes a plurality of first conducting portions and a plurality of second conducting portions and wherein each said first conducting portion is adjacent a second conducting portion and each said second conducting portion is adjacent a first conducting portion.

9. The switch assembly of claim 8, wherein said one of said conducting portions is one of said first conducting portions and said first and second adjacent conducting portions are each one of said second conducting portions.

10. The switch assembly of claim 9, wherein each said second conducting portion is spaced from a first adjacent first conducting portion by said first distance and spaced from a second adjacent first conducting portion by said second distance.

11. The switch assembly of claim 10, further comprising a microprocessor having a first input coupled with said plurality of first conducting portions, a second input coupled with said plurality of second conducting portions, a third input coupled to said electrical contact portion and an output for communicating said generated digital electrical signals.

12. The switch assembly of claim 11, wherein said microprocessor comprises a decoder coupled to said inputs and a pulse generator coupled to said decoder, said decoder detecting when said contactor portion contacts one or more of said conducting portions and said pulse generator responsively generating said digital electrical signals.

13. The switch assembly of claim 12, wherein said plurality of first conducting portions are normally biased with a positive voltage, said plurality of second conducting portions are normally biased with a positive voltage, said contactor portion is coupled to electrical ground and wherein said decoder detects when said contactor portion moves into or out of contact with one or more of said conducting portions by detecting when said first or second inputs change between a positive voltage and electrical ground.

14. A device for generating electrical signals, comprising:

a plurality of electrical conducting members having a preselected voltage value arranged in a plurality of segments, each said segment including a first and a second conducting member, said plurality of segments being aligned adjacent each other such that a first distance between said first and second conducting members within each said segment is less than a second distance between either said conducting member and a conducting member in an adjacent segment;

an electrical contactor member having a dimension that is greater than said first distance and smaller than said second distance and that is moveable relative to said plurality of electrical conducting members, said contactor member being moveable between said segments and between four positions within each segment including a first position where said contactor member contacts said first conducting member and changes the voltage value of said first conducting member from said preselected value, a second position where said contactor member contacts said second conducting member and changes the voltage value of said second conducting member from said preselected value, a third position where said contactor member contacts both of said first and second conducting members and changes the voltage value of both said conducting members from said preselected value, and a fourth position where said contactor member does not contact either of said first or second conducting members and where said voltage value of said conducting members is said preselected value; and a microprocessor coupled with said conducting members and said contactor member, said microprocessor selectively generating digital electrical signals responsive to changes in the voltage values of one or more of said conducting members.

15. The device of claim 14, further comprising a base and a control knob movably supported for movement relative to said base and wherein said conducting members are supported on one of said base or said control knob and said contactor member is supported on the other of said base or said control knob such that movement of said control knob relative to said base moves said contactor between said first, second, third and fourth positions.

16. The device of claim 14, wherein said microprocessor comprises a decoder and a pulse generator, said decoder having a first input coupled to said first conducting members, a second input coupled to said second conducting members and a third input coupled to said contactor, said decoder detecting changes in said voltage of one or more of said contacting portions as caused by movement of said contactor member between one or more of said first, second, third or fourth positions, said pulse generator being coupled to said decoder and selectively producing said digital electrical signals responsive to said detected changes.

17. The device of claim 14, wherein said plurality of conducting members are equally radially spaced from a central axis and wherein said electrical contactor member is moveable about said central axis.

18. The device of claim 14, wherein there is only one said electrical contactor member that is made from a single piece of conductive material.

* * * * *